United States Patent
Yamashita et al.

(10) Patent No.: US 9,048,111 B2
(45) Date of Patent: Jun. 2, 2015

(54) SEMICONDUCTOR DEVICE

(71) Applicant: Mitsubishi Electric Corporation, Tokyo (JP)

(72) Inventors: Junichi Yamashita, Tokyo (JP); Tomohide Terashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/253,269

(22) Filed: Apr. 15, 2014

(65) Prior Publication Data

US 2015/0008557 A1    Jan. 8, 2015

(30) Foreign Application Priority Data

Jul. 4, 2013  (JP) .................................. 2013-140639

(51) Int. Cl.
*H01L 29/06*    (2006.01)
*H01L 21/762*   (2006.01)
*H01L 27/12*    (2006.01)

(52) U.S. Cl.
CPC ...... *H01L 29/0649* (2013.01); *H01L 21/76283* (2013.01); *H01L 21/76264* (2013.01); *H01L 27/1203* (2013.01); *H01L 21/76289* (2013.01)

(58) Field of Classification Search
CPC ............ H01L 29/0649; H01L 27/1203; H01L 21/76264; H01L 21/76289; H01L 21/76283
See application file for complete search history.

(56) References Cited

U.S. PATENT DOCUMENTS

| 5,049,968 A | 9/1991 | Nakagawa et al. |
| 5,072,287 A | 12/1991 | Nakagawa et al. |
| 5,644,157 A | 7/1997 | Iida et al. |

FOREIGN PATENT DOCUMENTS

| JP | H02-168646 A | 6/1990 |
| JP | H06-232149 A | 8/1994 |
| JP | H07-307399 A | 11/1995 |
| JP | H09-139422 A | 5/1997 |

*Primary Examiner* — Long Pham
(74) *Attorney, Agent, or Firm* — Studebaker & Brackett PC

(57) ABSTRACT

A semiconductor device includes a substrate, a buried insulating film formed on the substrate, an SOI layer formed on the buried insulating film, an insulating film formed to extend from a top surface of the SOI layer to the buried insulating film and to divide the SOI layer into a first SOI layer and a second SOI layer isolated from the first SOI layer, an element formed in the first SOI layer, and an electrode having at one end thereof a pad located directly above the second SOI layer, the other end of the electrode being connected to the first SOI layer. A cavity region is formed between the buried insulating film and the substrate directly below the first SOI layer. The portion of the buried insulating film directly below the second SOI layer is at least partially in direct contact with the substrate.

5 Claims, 4 Drawing Sheets

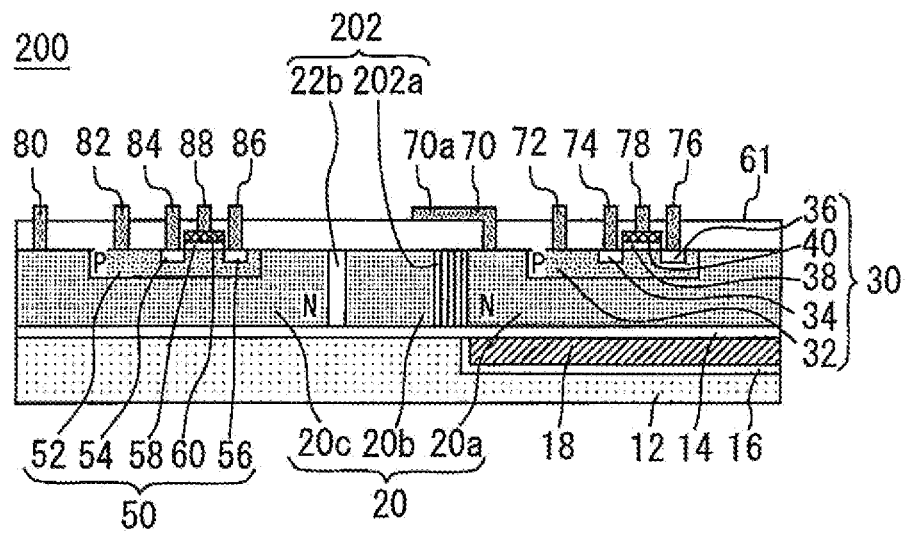
F I G. 5
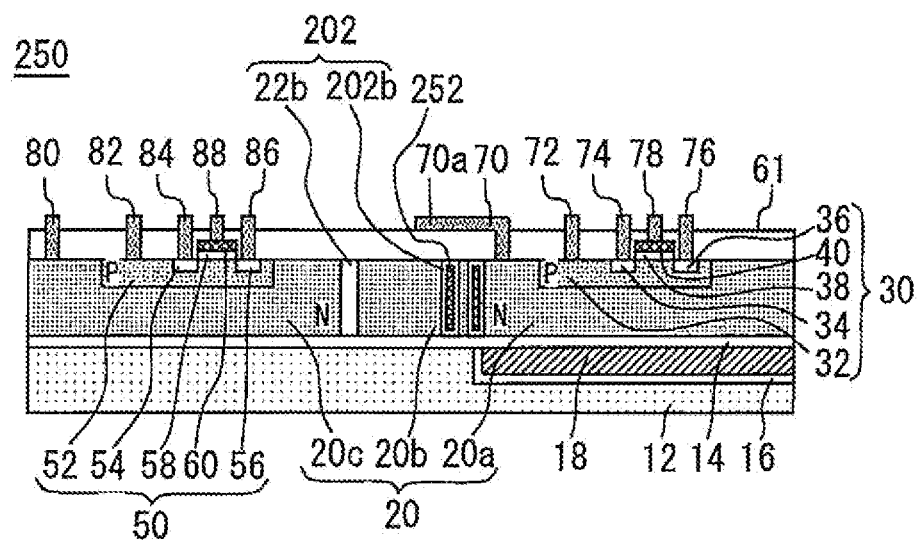
F I G. 6

US 9,048,111 B2

SEMICONDUCTOR DEVICE

BACKGROUND OF THE INVENTION

1. Field of the Invention

The present invention relates to a high voltage semiconductor device for use in higher power applications.

2. Background Art

Japanese Laid-Open Patent Publication No. H02-168646 discloses a semiconductor device in which an SOI (semiconductor on insulator) layer is formed on a substrate with a buried oxide film ($SiO_2$ film) interposed therebetween. IGBTs are formed in the SOI layer. A void (or cavity region) is formed between the buried oxide film and the substrate directly below the region in which the IGBTs are formed.

The cavity region formed between the buried insulating film (or oxide film) and the substrate serves to enhance the breakdown voltage of the semiconductor device. It has been found, however, that the formation of the cavity region decreases the mechanical strength of the semiconductor device. A decrease in the mechanical strength of the semiconductor device may result in the semiconductor device being damaged, e.g., when wires are wire-bonded to its electrodes or when it is sealed with a resin.

SUMMARY OF THE INVENTION

The present invention has been made to solve the above problems. It is, therefore, an object of the present invention to provide a semiconductor device in which a cavity region is formed between the substrate and the overlying buried insulating film in such a manner that the semiconductor device has an increased breakdown voltage while yet having adequate mechanical strength.

The features and advantages of the present invention may be summarized as follows.

According to one aspect of the present invention, a semiconductor device includes a substrate, a buried insulating film formed on the substrate, an SOI layer formed on the buried insulating film, an insulating film formed to extend from a top surface of the SOI layer to the buried insulating film and to divide the SOI layer into a first SOI layer and a second SOI layer isolated from the first SOI layer, an element formed in the first SOI layer, and an electrode having at one end thereof a pad located directly above the second SOI layer, the other end of the electrode being connected to the first SOI layer, wherein a cavity region is formed between the buried insulating film and the substrate directly below the first SOI layer, and wherein the portion of the buried insulating film directly below the second SOI layer is at least partially in direct contact with the substrate.

Other and further objects, features and advantages of the invention will appear more fully from the following description.

BRIEF DESCRIPTION OF THE DRAWINGS

FIG. 5 is a cross-sectional view of a semiconductor device in accordance with a second embodiment of the present invention;

FIG. 6 is a cross-sectional view of a semiconductor device in accordance with a third embodiment of the present invention;

DETAILED DESCRIPTION OF THE PREFERRED EMBODIMENTS

Figure 1:
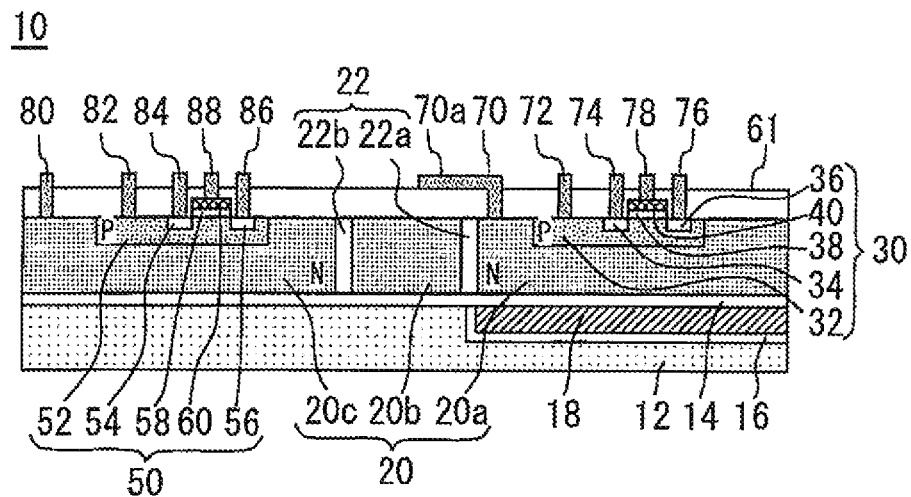
FIG. 1 is a cross-sectional view of a semiconductor device in accordance with a first embodiment of the present invention.

Semiconductor devices in accordance with embodiments of the present invention will be described with reference to the accompanying drawings. Throughout the specification the same or corresponding components are designated by the same reference numerals and may be described only once.

First Embodiment

FIG. 1 is a cross-sectional view of a semiconductor device 10 in accordance with a first embodiment of the present invention. The semiconductor device 10 includes a substrate 12. The substrate 12 is made of an N-type silicon material and electrically grounded (i.e., connected to a reference potential). A buried insulating film 14 is formed on the substrate 12. The buried insulating film 14 is, e.g., a silicon oxide film, in which case it may be referred to as "buried oxide" or "BOX."

An SOI layer 20 is formed on the buried insulating layer 14. The SOI layer 20 is a silicon thin film on the buried insulating film 14. An insulating film 22 is formed to extend from the top surface of the SOI layer 20 to the buried insulating film 14. The insulating film 22 is, e.g., a silicon oxide film and is formed by forming trenches in the SOI layer 20 and then filling these trenches with silicon oxide (a known manufacturing method).

The SOI layer 20 is divided by the insulating film 22 into three smaller SOI layers: a first SOI layer 20a serving as a high potential circuit region where a high potential circuit is formed; a second SOI layer 20b isolated from the first SOI layer 20a and serving as a high potential circuit bonding pad region where the bonding pads for the high potential circuit in the first SOI layer 20a are disposed; and a third SOI layer 20c isolated from both the first SOI layer 20a and the second SOI layer 20b and serving as a low potential circuit region where a low potential circuit is formed. As shown in FIG. 1, the insulating film 22 includes an insulating film 22a formed between the first SOI layer 20a and the second SOI layer 20b and an insulating film 22b formed between the second SOI layer 20b and the third SOI layer 20c.

An element 30 is formed in the first SOI layer 20a (which serves as a high potential circuit region). The element 30 will be described. The element 30 has a P-diffusion region 32 formed in the top surface of the first SOI layer 20a and serving as a well. An N-diffusion region 34 and an N-diffusion region 36 are formed in the surface of the P-diffusion region 32 and serve as a source and a drain (or a drain and a source). A gate insulating film 38 is formed on the P-diffusion region 32 between the N-diffusion regions 34 and 36. The gate insulating film 38 is, e.g., a silicon oxide film, and a gate electrode 40 of polysilicon is formed on the gate insulating film 38. The element 30 is an NMOS transistor on the high potential circuit side of the device.

An element 50 is formed in the third SOI layer 20c (which serves as a low potential circuit region). The element 50 will be described. The element 50 has a P-diffusion region 52 formed in the top surface of the third SOI layer 20c and serving as a well. An N-diffusion region 54 and an N-diffusion region 56 are formed in the surface of the P-diffusion region 52 and serve as a source and a drain (or a drain and a source). A gate insulating film 58 is formed on the P-diffusion region 52 between the N-diffusion regions 54 and 56. The gate insulating film 58 is, e.g., a silicon oxide film, and a gate electrode 60 of polysilicon is formed on the gate insulating film 58. The element 50 is an NMOS transistor in the low potential circuit region.

It should be noted that the first SOI layer 20a and the third SOI layer 20c may have formed therein semiconductor elements such as PMOS transistors, bipolar transistors, or diffused resistances instead of or in addition to the elements 30 and 50.

A top surface insulating layer 61 is formed on the SOI layer 20. The top surface insulating layer 61 is, e.g., a silicon oxide film. Thus, the second SOI layer 20b described above is surrounded by the top surface insulating layer 61, the insulating film 22, and the buried oxide film 14. Electrodes 70, 72, 74, 76, 78, 80, 82, 84, 86 and 88 are provided on the surface of the top surface insulating layer 61 and penetrate through the top surface insulating layer 61. These electrodes are formed of a metal film of, e.g., aluminum.

The electrode 70 is used to apply a voltage to the first SOI layer 20a serving as a high potential circuit region. Specifically, one end of the electrode 70 has a pad 70a, and the other end of the electrode 70 is connected to the first SOI layer 20a, with the pad 70a being located directly above the second SOI layer 20b serving as a high potential circuit bonding pad region.

The electrode 72 is connected to the P-diffusion region 32. The electrode 74 is connected to the N-diffusion region 34. The electrode 76 is connected to the N-diffusion region 36. The electrode 78 is connected to the gate electrode 40. The electrode 80 is connected to the third SOI layer 20c. The electrode 82 is connected to the P-diffusion region 52. The electrode 84 is connected to N-diffusion region 54. The electrode 86 is connected to the N-diffusion region 56. The electrode 88 is connected to the gate conductive film 60. It should be noted that the second SOI layer 20b serving as a high potential circuit bonding pad region is a floating region (or floating potential region), since no electrode is directly connected to the second SOI layer 20b.

A high voltage is applied to the electrode 70 (and hence to the first SOI layer 20a), and the substrate 12 is grounded. This means that the semiconductor device 10 must have a high breakdown voltage between the first SOI layer 20a and the substrate 12. In order to achieve this without increasing the thickness of the buried insulating film 14, a cavity region 18 is formed between the buried insulating film 14 and the substrate 12 directly below the first SOI layer 20a in the semiconductor device 10 of the present embodiment, thereby increasing the breakdown voltage between the first SOI layer 20a and the substrate 12. Specifically, the cavity region 18 is surrounded by the buried insulating film 14 and an oxide film 16 which is formed between the cavity region 18 and the substrate 12. The portion of the insulating film 14 directly below the second SOI layer 20b extends over and is in contact with the substrate 12. The portion of the insulating film 14 directly below the third SOI layer 20c also extends over and is in contact with the substrate 12.

Figure 2:
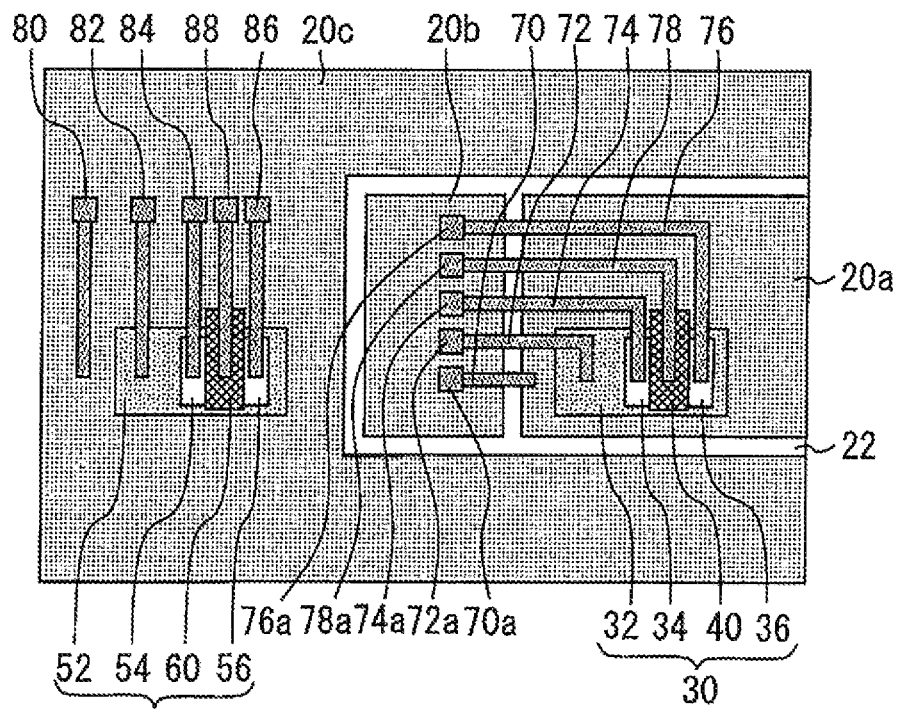
FIG. 2 is a plan view of the semiconductor device shown in FIG. 1.

FIG. 2 is a plan view of the semiconductor device shown in FIG. 1. The top surface insulating layer 61 is omitted from FIG. 2 for convenience of illustration. The insulating film 22 is formed to surround the second SOI layer 20b. As a result, the second SOI layer 20b is isolated from the first SOI layer 20a and the third SOI layer 20c.

The electrodes 72, 74, 76, and 78 have pads 72a, 74a, 76a, and 78a, respectively. The pads 70a, 72a, 74a, 76a, and 78a are formed directly above the second SOI layer 20b. A wire is wire-bonded to each of these pads.

Figure 3:
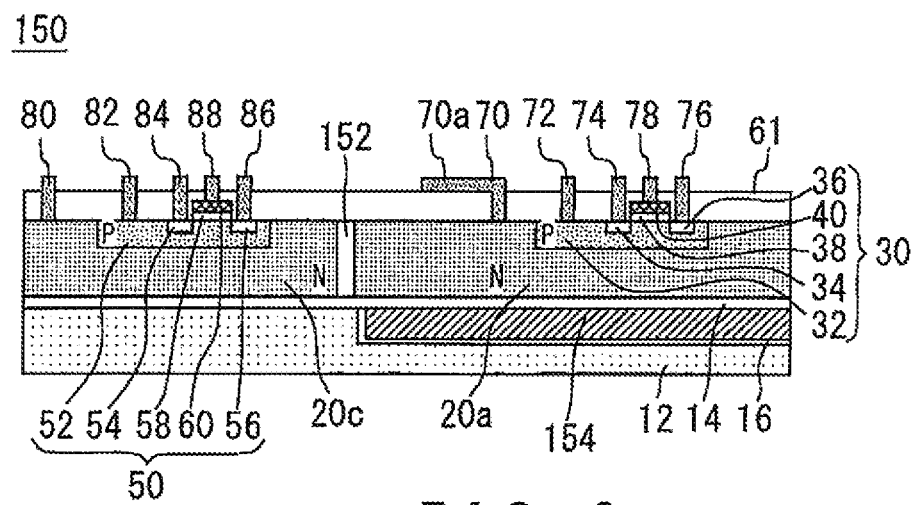
FIG. 3 is cross-sectional view of the comparative semiconductor device.

Before describing the advantages of the semiconductor device of the first embodiment, a comparative semiconductor device 150 will be described. FIG. 3 is a cross-sectional view of the comparative semiconductor device 150. The comparative semiconductor device 150 differs from the semiconductor device 10 of the first embodiment primarily in that the second SOI layer 20b serving as a high potential circuit bonding pad region is omitted and the third SOI layer 20c serving as a low potential circuit region is isolated by an insulating film 152 from the first SOI layer 20a serving as a high potential circuit region. Thus, the second SOI layer 20b, which is a novel feature of the first embodiment, is not formed in the comparative semiconductor device 150. The comparative semiconductor device 150 has a cavity region 154 formed directly below the pad 70a of the electrode 70.

Figure 4:
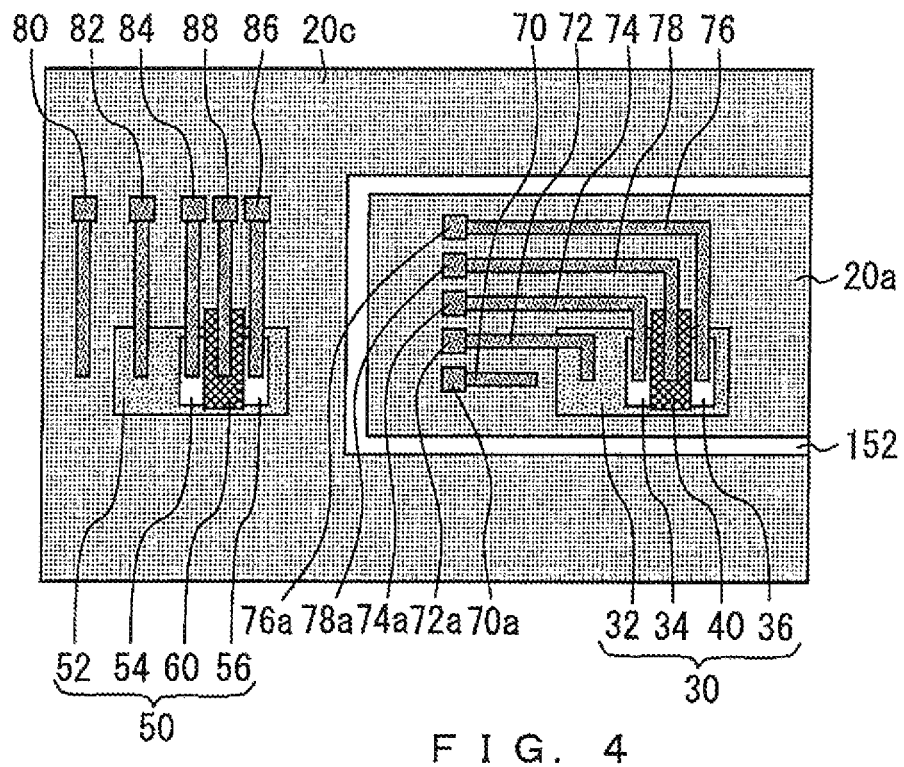
FIG. 4 is a plan view of the semiconductor device shown in FIG. 3.

FIG. 4 is a plan view of the semiconductor device 150 shown in FIG. 3. Though not shown in FIG. 4, the cavity region 154 is located directly below the first SOI layer 20a, that is, directly below the pads 70a, 72a, 74a, 76a, and 78a. Since the cavity region 154 of the comparative semiconductor device 150 is formed to extend wider than the cavity region 18 of the semiconductor device 10 of the first embodiment, the semiconductor device 150 is considered to have inadequate mechanical strength. It should be noted that examples of mechanical stress applied to the semiconductor devices 10 and 150 include mechanical stress resulting from wire-bonding to the electrodes (or pads) of the semiconductor device and mechanical stress resulting from sealing the semiconductor device in a package with a resin.

In the semiconductor device 10 of the first embodiment, the portion of the insulating film 14 directly below the pads 70a, 72a, 74a, 76a, and 78a is in direct contact with the substrate 12. This means that the structure underlying the these pads, which receives and absorbs the mechanical stress applied to the semiconductor device 10 resulting from wire-bonding to the pads, has no cavity region, thereby avoiding damage to the semiconductor device 10 which might otherwise occur when wire-bonding to the pads.

It should be further noted that since the semiconductor device 10 of the first embodiment has the second SOI layer 20b, and the comparative semiconductor device 150 does not, the first SOI layer 20a of the semiconductor device 10 is smaller in area than the first SOI layer 20a of the comparative semiconductor device 150. As a result, the cavity region 18 underlying the first SOI layer 20a of the semiconductor device 10 is also smaller than the cavity region 154 underlying the first SOI layer 20a of the comparative semiconductor device 150 (as described above). This results in the semiconductor device 10 having greater mechanical strength than the comparative semiconductor device 150, meaning that the mechanical stress resulting from mounting the semiconductor device 10 in a package and sealing the package is less likely to damage the semiconductor device 10, as compared to the comparative semiconductor device 150.

Further, since the second SOI layer 20b is in a "floating" state (that is, it is not connected to any source of potential), a high voltage is not directly applied to it. The voltage applied between the substrate 12 and the pads 70a, 72a, 74a, 76a, and 78a is divided across two capacitances: the capacitance formed by the substrate 12, the buried insulating film 14, and the second SOI layer 20b and the capacitance formed by the second SOI layer 20b, the top surface insulating layer 61, and the pads 70a, 72a, 74a, 76a, and 78a.

As a result, the electric field strength directly below the pads 70a, 72a, 74a, 76a, and 78a is relatively weak, making it possible to increase the breakdown voltage of the semiconductor device 10 without increasing the thickness of the buried insulating film 14. A reduction in the thickness of the buried insulating film 14 results in decreased cost of the semiconductor device 10 and also makes it possible to reduce warping of the wafer during the manufacturing process. Thus the semiconductor device 10 of the first embodiment has therein the cavity region 18 formed between the buried insulating film 14 and the substrate 12 in such a manner that the semiconductor device 10 has an increased breakdown voltage while yet having adequate mechanical strength.

The portion of the buried insulating film 14 directly below the second SOI layer 20b need not be in direct contact with the substrate 12 throughout the entire bottom surface of the portion. That is, a cavity region which extends along a part of the bottom surface of that portion of the buried insulating film 14 may be provided between the buried insulating film 14 and the substrate 12. Such a cavity region also serves to enhance the breakdown voltage of the semiconductor device, and the semiconductor device still has adequate mechanical strength, since the portion of the buried insulating film 14 directly below the second SOI layer 20b is partially in direct contact with the substrate 12. Thus, the advantages described above in connection with the first embodiment can be obtained as long as the portion of the buried insulating film 14 directly below the second SOI layer 20b is at least partially in direct contact with the substrate 12.

The elements 30 and 50 may not be NMOS transistors. Instead they may be, e.g., PMOS transistors, NPN transistors, PNP transistors, diodes, diffused resistors, or capacitors. It should be noted that the above alterations to the semiconductor device of the first embodiment may also be made to the semiconductor devices of the subsequently described embodiments.

Second Embodiment

FIG. 5 is a cross-sectional view of a semiconductor device 200 in accordance with a second embodiment of the present invention. The following description of the semiconductor device 200 will be primarily limited to the differences from the semiconductor device 10 described above. As shown, a plurality of insulating films 202a are formed between the first SOI layer 20a and the second SOI layer 20b. The insulating films 202a are, e.g., silicon oxide films. As can be seen from FIG. 5, there are actually three insulating films 202a.

Each of the three insulating films 202a forms a capacitance, resulting in a reduced electric field between the first SOI layer 20a and the second SOI layer 20b. Therefore, even if each insulating film 202a is thinner than the insulating film 22 of the first embodiment, the semiconductor device 200 can be configured to have a breakdown voltage substantially equal to that of the semiconductor device 10. The thickness of the buried insulating film 14 may be reduced to reduce the manufacturing cost of the semiconductor device. It should be noted that although in the above example the semiconductor device 200 has three insulating films 202a, it is to be understood that it may have any plurality of insulating films 202a.

Third Embodiment

FIG. 6 is a cross-sectional view of a semiconductor device 250 in accordance with a third embodiment of the present invention. The following description of the semiconductor device 250 will be primarily limited to the differences from the semiconductor device 10 described above. A plurality of isolation structures each including an insulating film 202b and a polysilicon-filled trench 252 are formed between the first SOI layer 20a and the second SOI layer 20b, thereby isolating these SOI layers from each other. The isolation structures are formed by a known manufacturing method which includes forming trenches in an SOI layer, oxidizing the inner walls of the trenches, and filling the trenches with polysilicon.

This means that there is no need to develop a new process for forming these isolation structures, which are each made up of an insulating film 202b and a polysilicon-filled trench 252.

The formation of each polysilicon-filled trench 252 surrounded by an insulating film 202b results in the formation of two capacitances. In this way it is possible to increase the number of capacitances formed between the first SOI layer 20a and the second SOI layer 20b. It should be noted that there may be any number of insulating films 202b and any number of polysilicon-filled trenches 252.

Fourth Embodiment

Figure 7:
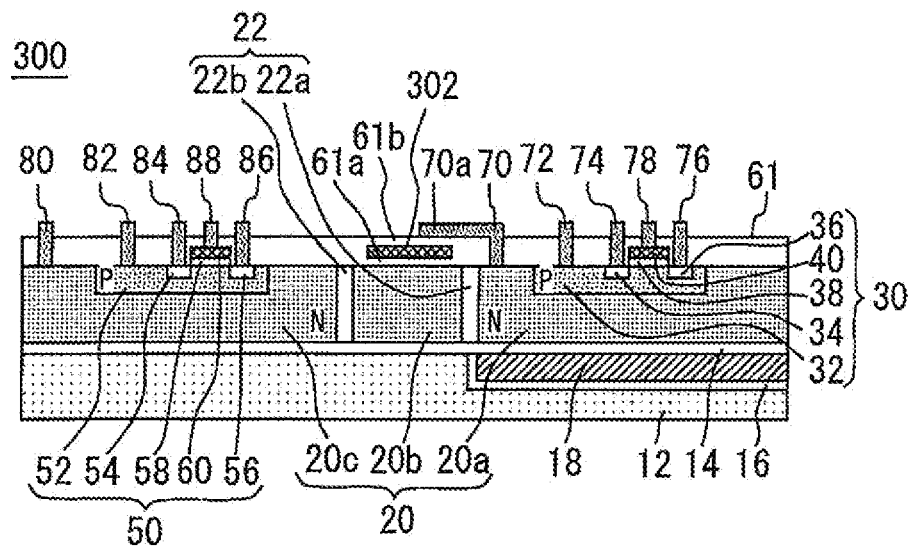
FIG. 7 is a cross-sectional view of a semiconductor device in accordance with a fourth embodiment of the present invention.

FIG. 7 is a cross-sectional view of a semiconductor device 300 in accordance with a fourth embodiment of the present invention. The following description of the semiconductor device 300 will be primarily limited to the differences from the semiconductor device 10 described above. A buried electrode 302 is formed in the top surface insulating layer 61 between the pad 70a and the second SOI layer 20b. The portion of the top surface insulating layer 61 underlying the buried electrode 302 is referred to herein as the lower insulating layer 61a. The portion of the top surface insulating layer 61 overlying the buried electrode 302 is referred to herein as the upper insulating layer 61b.

The voltage applied between the substrate 12 and the pads 70a, 72a, 74a, 76a, and 78a is divided across three capacitances: the capacitance formed by the substrate 12, the buried insulating film 14, and the second SOI layer 20b, the capacitance formed by the second SOI layer 20b, the lower insulating layer 61a, and the buried electrode 302, and the capacitance formed by the buried electrode 302, the upper insulating layer 61b, and the pads 70a, 72a, 74a, 76a, and 78a. These three capacitances serve to reduce electric field strength, making it possible to increase the breakdown voltage of the semiconductor device 300.

It should be noted that the buried electrode 302 can be formed at the same time as the gate electrodes 40 and 46, meaning that the buried electrode 302 can be formed without increasing processing costs.

Fifth Embodiment

Figure 8:
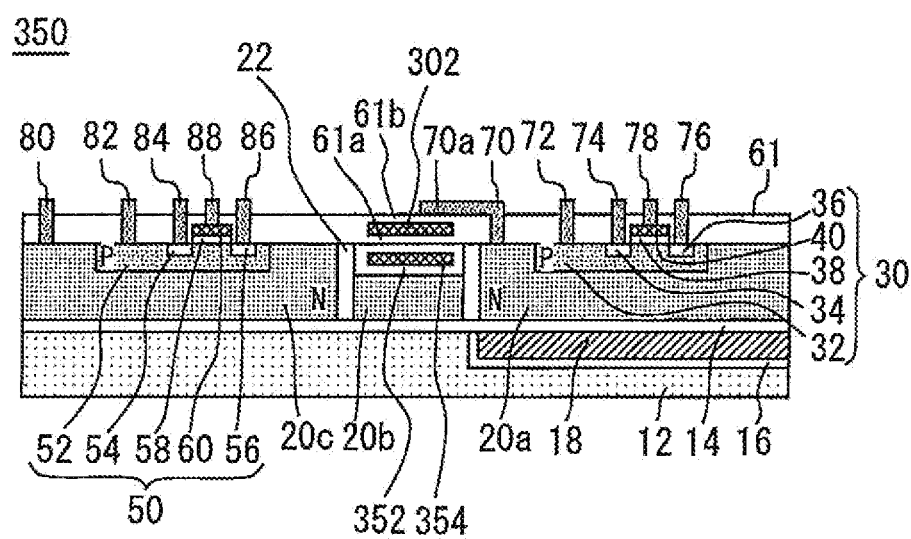
FIG. 8 is a cross-sectional view of a semiconductor device in accordance with a fifth embodiment of the present invention.

FIG. 8 is a cross-sectional view of a semiconductor device 350 in accordance with a fifth embodiment of the present invention. The following description of the semiconductor device 350 will be primarily limited to the differences from the semiconductor device 300 described above. An additional insulating layer 352 is formed on the second SOI layer 20b and surrounded by the insulating film 22, as shown in FIG. 8. The additional insulating layer 352 has an additional buried electrode 354 formed therein.

The formation of the additional insulating layer 352 and the additional buried electrode 354 results in the formation of a capacitance formed by the additional buried electrode 354, the additional insulating layer 352, the lower insulating layer 61a, and the buried electrode 302. Thus, the semiconductor device 350 has four capacitances serving to reduce electric field strength (whereas the semiconductor device 300 of the fourth embodiment has only three such capacitances), resulting in the semiconductor device 350 having a greater breakdown voltage than the semiconductor device 300.

Although in the example shown in FIG. 8 the semiconductor device 350 has both the buried electrode 302 and the additional buried electrode 354, it is to be understood that the buried electrode 302 may be omitted from the semiconductor device 350. It should be noted that features of the semiconductor devices of embodiments described above may be combined where appropriate.

Thus the present invention enables manufacture of a semiconductor device in which a cavity region is formed between the substrate and the overlying buried insulating film in such a manner that the semiconductor device has an increased breakdown voltage while yet having adequate mechanical strength.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-140639, filed on Jul. 4, 2013 including specification, claims, drawings and summary, on which the Convention priority of the present application is based, is incorporated herein by reference in its entirety.

What is claimed is:

1. A semiconductor device comprising:
a substrate;
a buried insulating film formed on said substrate;
an SOI layer formed on said buried insulating film;
an insulating film formed to extend from a top surface of said SOI layer to said buried insulating film and to divide said SOI layer into a first SOI layer and a second SOI layer isolated from said first SOI layer;
an element formed in said first SOI layer; and
an electrode having at one end thereof a pad located directly above said second SOI layer, the other end of said electrode being connected to said first SOI layer;
wherein a cavity region is formed between said buried insulating film and said substrate directly below said first SOI layer; and
wherein the portion of said buried insulating film directly below said second SOI layer is at least partially in direct contact with said substrate.

2. The semiconductor device according to claim 1, further comprising a plurality of said insulating films formed between said first and second SOI layers.

3. The semiconductor device according to claim 1, further comprising a polysilicon-filled trench formed in said insulating film.

4. The semiconductor device according to claim 1, further comprising:
a top surface insulating layer formed between said pad and said second SOI layer; and
a buried electrode formed in said top surface insulating layer.

5. The semiconductor device according to claim 1, further comprising:
an additional insulating layer formed on said second SOI layer and surrounded by said insulating film; and
an additional buried electrode formed in said additional insulating layer.

* * * * *